United States Patent
Park

(10) Patent No.: US 8,795,865 B2
(45) Date of Patent: Aug. 5, 2014

(54) BATTERY PACK

(75) Inventor: Junyoung Park, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 749 days.

(21) Appl. No.: 12/358,032

(22) Filed: Jan. 22, 2009

(65) Prior Publication Data

US 2009/0246615 A1 Oct. 1, 2009

(30) Foreign Application Priority Data

Mar. 31, 2008 (KR) ........................ 10-2008-0030050

(51) Int. Cl.
*H01M 2/10* (2006.01)
*H01M 4/02* (2006.01)

(52) U.S. Cl.
CPC .................................... *H01M 4/02* (2013.01)
USPC ............................................. 429/97; 429/96

(58) Field of Classification Search
CPC ..................................................... H01M 4/02
USPC ......................................................... 429/96
See application file for complete search history.

(56) References Cited

U.S. PATENT DOCUMENTS

| | | | |
|---|---|---|---|
| 2002/0034680 A1 | 3/2002 | Inoue et al. | |
| 2003/0027040 A1 | 2/2003 | Asahina et al. | |
| 2006/0127759 A1 | 6/2006 | Bechtold et al. | |
| 2008/0220316 A1 | 9/2008 | Berkowitz et al. | |
| 2009/0297942 A1 | 12/2009 | Jang et al. | |
| 2009/0317712 A1 | 12/2009 | Kim et al. | |

FOREIGN PATENT DOCUMENTS

| | | |
|---|---|---|
| JP | 11-214821 | 8/1999 |
| JP | 2000-331717 | 11/2000 |
| JP | 2002-352789 | 12/2002 |
| JP | 2003-023237 | 1/2003 |
| JP | 2003-078241 | 3/2003 |
| JP | 2004-022363 | 1/2004 |
| JP | 2004-303618 | 10/2004 |
| JP | 2005-149909 | 6/2005 |
| JP | 2005-236206 | 9/2005 |
| JP | 2006-040775 | 2/2006 |
| JP | 2006-073457 | 3/2006 |
| KR | 1020050122682 | 12/2005 |
| KR | 1020060103030 | 9/2006 |
| KR | 1020060112393 | 11/2006 |
| KR | 1020060113802 | 11/2006 |
| KR | 1020070033834 | 3/2007 |
| KR | 1020070042033 | 4/2007 |
| KR | 1020070065560 | 6/2007 |
| KR | 1020070068847 | 7/2007 |
| KR | 1020070097151 | 10/2007 |

*Primary Examiner* — Gary Harris
(74) *Attorney, Agent, or Firm* — Knobbe Martens Olson & Bear LLP

(57) ABSTRACT

A battery pack that prevents a solder material from flowing down due to a tab electrically connecting a battery to a protective circuit board, thereby improving reliability, coupling efficiency, safety, and productivity is disclosed. The battery pack includes: a multi-cell battery having a positive electrode and a negative electrode, in which a plurality of battery cells are electrically connected to each other; a protective circuit board electrically connected to the multi-cell battery and having via holes; a pair of conductive tabs each including an insert portion inserted into a corresponding via hole and a bending portion integrally extending from the insert portion and bent from the insert portion; and a pair of soldering portions each being formed at at least some portions of a corresponding insert portion and a corresponding bending portion.

15 Claims, 3 Drawing Sheets

BATTERY PACK

CROSS-REFERENCE TO RELATED APPLICATION

This application claims priority to and the benefit of Korean Patent Application No. 2008-0030050, filed on Mar. 31, 2008, in the Korean Intellectual Property Office, the disclosure of which is incorporated herein, by reference.

BACKGROUND OF THE INVENTION

1. Field of the Invention

Aspects of the present invention relate to a battery pack, and more particularly to, a battery pack that prevents a solder material from flowing down due to a tab electrically connecting a battery to a protective circuit board, thereby improving the reliability, coupling efficiency, safety, and productivity of the battery pack.

2. Description of the Related Art

Recently, compact and light portable electric and electronic appliances, such as cellular phones, laptop computers, camcorders, are being actively developed and produced. Battery packs are embedded in the portable appliances respectively to operate the portable appliances even in places where separate power sources cannot be provided. Considering cost, the battery packs are recently employing chargeable and dischargeable batteries. The batteries include nickel-cadmium (Ni—Cd) batteries, nickel-metal hydride (Ni-MH) batteries, lithium batteries, and lithium ion secondary batteries.

In particular, the lithium ion secondary batteries are being widely employed as power sources of portable electronic appliances, and have operation voltages approximately three times as high as those of nickel-cadmium batteries and nickel-metal hydride batteries. They are also being widely employed due to their high energy density per weight.

Considering the consumption power and use time of a laptop computer that is representative of portable appliances, a plurality of lithium ion secondary cells are being arranged in series or in parallel in the laptop computer.

In this case, the lithium ion secondary cells for a laptop computer are embedded in a battery pack so as to attach or detach them to and from the laptop computer.

A protective circuit board for allowing or interrupting current flow is generally embedded in the battery pack to charge or discharge the battery pack, thereby preventing the lithium ion secondary cells from overheating, deteriorating, and exploding.

The protective circuit board is electrically connected to the lithium ion secondary cells through lead tabs, which correspond to a high current path through which charging and discharging currents of the lithium ion secondary cells flow.

In this case, the lead tabs are attached to the lithium ion secondary cells first, and then are electrically connected to the protective circuit board. The lead tabs are generally manually soldered to the protective circuit board. In this case, since the portions of the protective circuit board to which the lead tabs are soldered correspond to the high current path, the amount of a solder material used in the portions of the protective circuit board becomes larger that those in the other portions.

In other words, when the lead tabs are manually soldered to the protective circuit board, the amount of the solder material in the soldered portions of the protective circuit board becomes larger, in which case the solder material may disadvantageously flow down. Accordingly, the solder material flowing down along the protective circuit board may damage or cause the protective circuit board to malfunction due to a short circuit of the protective circuit board.

Moreover, when the protective circuit board coupled to the lithium ion secondary cells through the lead tabs is covered with a case to form the battery pack, the portions of the protective circuit board to which the lead tabs are coupled may be distorted or be erroneously assembled. In this case, it is necessary to solder the protective circuit board and the lead tabs again after removing the solder material, which increases manufacturing time and cost.

Furthermore, as the contact areas between the protective circuit board and the lead tabs become smaller, the amount of the solder material for coupling the lead tabs to the protective circuit board is also reduced, in which case the coupling forces between the protective circuit board and the lead tabs may weaken. The weak coupling forces between the protective circuit board and the lead tabs may cause the lead tabs to be separated from the protective circuit board. Furthermore, after long time use of the battery pack, the contact resistances between the protective circuit board and the lead tabs may increase due to cracking of the solder material, causing an increase in the internal resistance of the battery pack.

BRIEF SUMMARY OF THE INVENTION

The present invention has been made in view of the above problems, and aspects of the present invention provide a battery pack that prevents a solder material from flowing down due to a tab when the tab electrically connected to a battery is soldered to a protective circuit board.

Aspects of the present invention further provide a battery pack that prevents a tab from being distorted when the tab electrically connected to a battery is soldered to a protective circuit board.

Aspects of the present invention further provide a battery pack with a tab design that can be more easily assembled when a battery and a protective circuit board are coupled to a case after the tab electrically connected to a battery is soldered to a protective circuit board.

Aspects of the present invention further provide a battery pack that enhances the coupling force of a tab to a protective circuit board when the tab electrically connected to a battery is soldered to a protective circuit board.

According to aspects of the present invention, there is provided a battery pack including: at least one battery having a positive electrode and a negative electrode; a protective circuit board electrically connected to the at least one battery and having at least one via hole; at least one conductive tab including an insert portion inserted into a corresponding via hole and a bending portion integrally extending from the insert portion and bent from the insert portion; and at least one soldering portion being formed at a corresponding insert portion and a corresponding bending portion.

According to aspects of the present invention, the at least one battery may comprise a multi-cell battery, wherein the at least one via hole comprises a pair of via holes, wherein the at least one conductive tab comprises a pair of conductive tabs, and wherein the at least one soldering portion comprises a pair of soldering portions each being formed at at least some portions of a corresponding insert portion and a corresponding bending portion.

According to aspects of the present invention, the protective circuit board may include an insulation substrate, at least one printed circuit patterns coupled to the insulation substrate, and at least one protective circuits electrically connected to the printed circuit patterns, at least one via hole passing through the insulation substrate, wherein the printed circuit pattern includes an internal pattern formed on an inner surface of the via hole, an upper pattern integrally extending from the internal pattern and extending to an upper surface of the insulation substrate, and a lower pattern integrally extending from the internal pattern and extending to the lower surface of the insulation substrate.

According to aspects of the present invention, the at least one via hole may have an elongated shape whose transverse width is different from a longitudinal width thereof, and may pass through the insulation substrate from the upper surface to the lower surface of the insulation substrate. The transverse width of the elongated via hole may be 2.2 to 8 times as long as its longitudinal width.

According to aspects of the present invention, the at least one conductive tab has a thickness 0.2 to 1.1 mm.

According to aspects of the present invention, the at least one conductive tab may be made of nickel or a nickel based alloy.

According to aspects of the present invention, the at least one conductive tabs may include a first conductive tab electrically connected to a positive electrode of the multi-cell battery and a second conductive tab electrically connected to a negative electrode of the multi-cell battery.

According to aspects of the present invention, the bending portion integrally may extend from a corresponding insert portion and may include a first bending portion coupled to a corresponding soldering portion and a second bending portion integrally extending from the first bending portion.

According to aspects of the present invention, the at least one conductive tab may further include an assembling error control region integrally extending from the bending portion to control an assembling error of the at least one battery and the protective circuit board.

According to aspects of the present invention, the assembling error control region may be bent several times in a direction perpendicular to a length of a corresponding conductive tab.

According to aspects of the present invention, the protective circuit board may further include a connector whose position is controlled by the assembling error control region.

According to aspects of the present invention, the soldering portions may include a first soldering portion formed between a corresponding insert portion and the protective circuit board and a second soldering portion having a volume being 30 to 60% of that of the first soldering portion.

According to aspects of the present invention, at least one conductive tab may further include a stopper portion integrally extending from a corresponding insert portion and having a width longer than that of the insert portion.

According to aspects of the present invention, the bending portion may have a convex recessed shape at a corresponding stopper portion.

According to aspects of the present invention, an end of the bending portion that integrally may extend from the insert portion is rounded.

The battery pack according to the present invention prevents a solder material from flowing down due to a tab when the tab electrically connected to a battery is soldered to a protective circuit board, thereby preventing malfunction of and damage to a protective circuit.

Further, the battery pack according to the present invention prevents a tab from being distorted when the tab electrically connected to a battery is soldered to a protective circuit board, thereby shortening manufacturing time.

Furthermore, the battery pack according to the present invention can be easily assembled due to a tab when a battery and a protective circuit board are coupled to a case after the tab electrically connected to a battery is soldered to a protective circuit board, thereby shortening manufacturing time.

Furthermore, the battery pack according to the present invention enhances the coupling force of a tab to a protective circuit board when the tab electrically connected to a battery is soldered to a protective circuit board, thereby enhancing stability.

BRIEF DESCRIPTION OF THE DRAWINGS

The aspects, features and advantages of the present invention will be more apparent from the following detailed description in conjunction with the accompanying drawings, in which.

DETAILED DESCRIPTION OF THE INVENTION

Figure 1A:
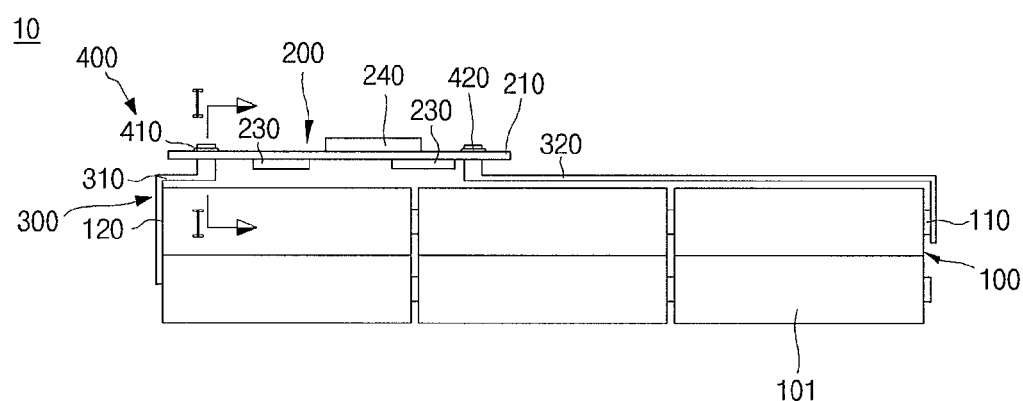
FIG. 1A is a front view illustrating a battery pack according to an exemplary embodiment of the present invention.

Hereinafter, the exemplary embodiments of the present invention will be described in detail with reference to the accompanying drawings. The same reference numerals are used throughout the drawings to refer to the same or like elements. Detailed descriptions of the same or like effects and operations of the exemplary embodiments incorporated herein will not be repeated.

Figure 1B:
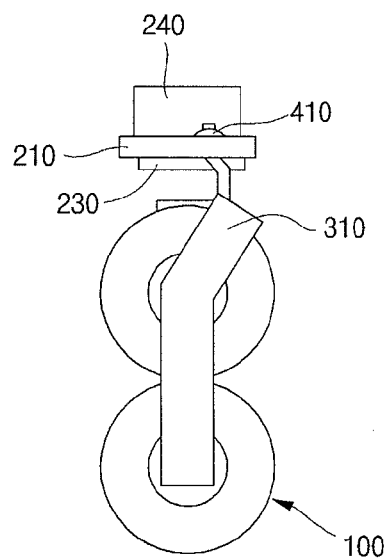
FIG. 1B is a left side view of the battery pack of FIG. 1A.
Figure 1C:
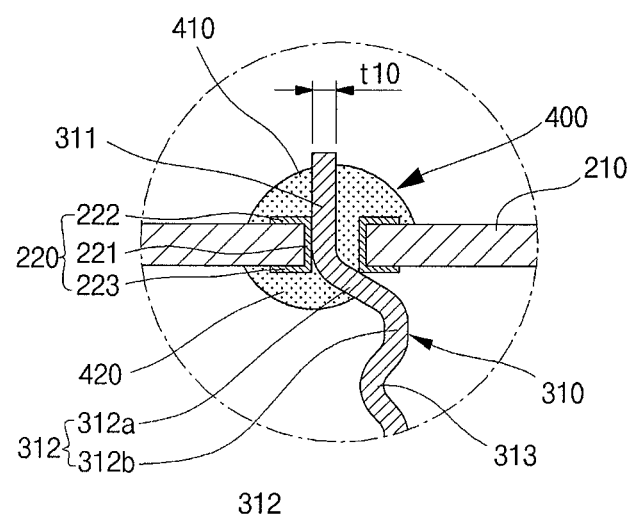
FIG. 1C is a cross-sectional view taken along line I-I of FIG. 1A.
Figure 1D:
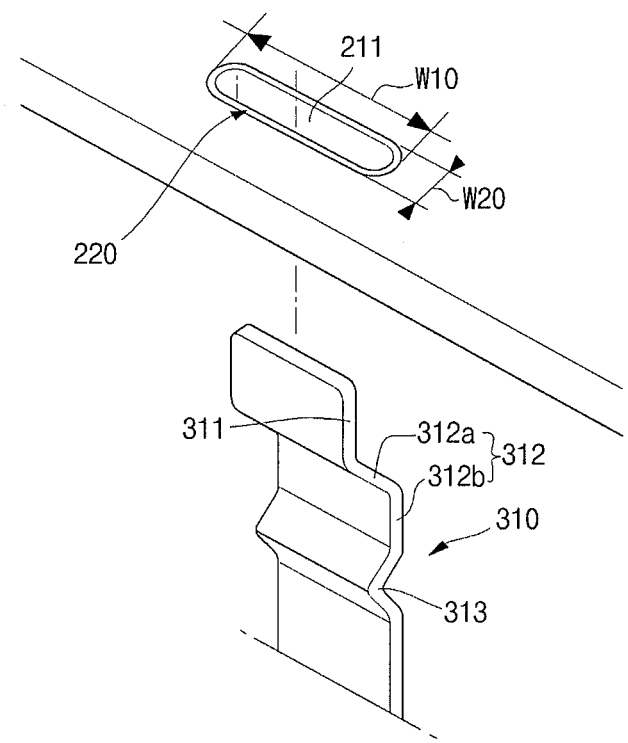
FIG. 1D is a partial exploded perspective view of a conductive tab separated from a protective circuit board illustrated in FIG. 1A.

FIG. 1A is a front view illustrating a battery pack according to an exemplary embodiment of the present invention. FIG. 1B is a left side view of the battery pack of FIG. 1A. FIG. 1C is a cross-sectional view taken along line I-I of FIG. 1A. FIG. 1D is a partial exploded perspective view of a conductive tab separated from a protective circuit board illustrated in FIG. 1A.

As illustrated in FIGS. 1A to 1D, the battery pack 10 includes a multi-cell battery 100, a protective circuit board 200, a pair of conductive tabs 300 and a pair of soldering portions 400.

The multi-cell battery 100 includes a plurality of battery cells 101. In this case, the battery cells 101 are rechargeable lithium ion cells. The battery cells 101 are connected in series or in parallel to each other to construct the multi-cell battery 100 having a positive electrode 110 and a negative electrode 120. The battery cells 101 are electrically connected to each other through the conductive tabs 300.

The protective circuit board 200 includes an insulation substrate 210, a pair of printed circuit patterns 220 and a pair of protective circuits 230. The protective circuit board 200 further includes a connector 240.

The insulation substrate 210 is made of a resin such as epoxy resin or bakelite. A plurality of layers may be compressed in the insulation layer 210. Via holes 211 passing through the upper and lower surfaces of the insulation substrate 210 are formed in the insulation substrate 210.

The via hole 211 has an elongated shape in which the transverse width W10 and the longitudinal width W20 thereof are different, and the elongated via hole vertically passes through the insulation substrate 210 from the upper surface to the lower surface of the insulation substrate 210. In the exemplary embodiment of the present invention, the transverse width W10 of the via hole 211 is much longer than its longitudinal width W20. The transverse width W10 of the elongated via hole is 2.2 to 8 times as long as its longitudinal width W20. The via hole 211 is configured to insert the conductive tab 300 having a plate-like shape thereinto so as to weld the conductive tab 300 to the multi-cell battery 100. When the ratio of the transverse width W10 to the longitudinal width W20 of the via hole 211 is below 2.2, a residual space in the via hole 211 becomes larger, in which case the conductive tab 300 may be distorted. On the other hand, when the ratio of the transverse width W10 to the longitudinal width W20 of the via hole 211 is above 8, the soldering portion 400 becomes too large, in which case the danger of a short circuit may increase.

The printed circuit patterns 220 are compressed in the insulation substrate 210. In this case, the printed circuit patterns 220 are formed on the upper and lower surfaces of the insulation substrate 210. The printed circuit patterns are inserted into an intermediate layer of the insulation substrate 210.

The printed circuit pattern 220 formed in each via hole 211 includes an internal pattern 221, an upper pattern 222 and a lower pattern 223.

The internal pattern 221 is formed on the inner surface of the via hole 211.

The upper pattern 222 integrally extends from the internal pattern 221 and extends to the upper surface of the insulation substrate 210.

The lower pattern 223 integrally extends from the internal pattern 221 and extends to the lower surface of the insulation substrate 210.

The internal pattern 221, the upper pattern 222 and the lower pattern 223 integrally covers the upper, intermediate and lower portions of the via hole 211, thereby improving the coupling force of the printed circuit pattern 220 to the insulation substrate 210. Accordingly, the coupling force of the soldering portions 400 coupled to the printed circuit patterns 221, to the protective circuit board 200 can be also improved.

The protective circuits 230 are electrically connected to the printed circuit patterns 220. The protective circuits 230 are seated on the insulation substrate 210. The protective circuits 230 measure the voltage of the multi-cell battery 100 and control electrical connection of the multi-cell battery 100 for charge and discharge of the multi-cell battery 100 according to the charge and discharge state of the multi-cell battery 100. More particularly, each protective circuit 230 includes a passive device (not shown), a charge field effect transistor (FET) (not shown), a discharge FET (not shown), a temperature device (not shown), and a control circuit (not shown). In this case, the control circuit turns on or off the charge FET and the discharge FET during charge and discharge of the multi-cell battery 100 to charge or discharge the multi-cell battery 100. The control circuit turns off the charge FET and the discharge FET when the multi-cell battery 100 is overheated or is supplied with overcurrent, to protect the multi-cell battery 100. The control circuit controls the charge FET and the discharge FET according to the overcharge and overdischarge state of the multi-cell battery 100 to protect the multi-cell battery 100. The control circuit calculates the charge and discharge cycles of the multi-cell battery 100, and extends the lifespan of the multi-cell battery 100 by controlling the charging current according to the calculated charge and discharge cycles.

The connector 240 is seated on the upper surface of the insulation substrate 210 and is electrically connected to the printed circuit patterns 220. The connector 240 is electrically connected to a battery contact terminal of a portable electronic device. In this case, the connector 240 is exposed to the outside of the case surrounding the multi-cell battery 100 and the protective circuit board 200. The position of the connector is determined in correspondence to the conductive tabs 300, in which case it is necessary for the conductive tabs 300 to have assembling error control regions 313 respectively in order to accurately dispose the connector 240 during the assembling operation of the battery pack 10.

The conductive tabs 300 include a first conductive tab 310 and a second conductive tab 320.

The first conductive tab 310 includes an insert portion 311 and a bending portion 312. The first conductive tab 310 may further include an assembling error control region 313.

The insert portion 311 is inserted into the via hole 211 and is electrically connected to the printed circuit pattern 220 through the soldering portion 400. In this case, the insert portion 311 is inserted into the via hole 211 to be soldered, and then the contact area of the via hole 211 and the insert portion 311 having a plate-like shape increases whereby the coupling force increases when the soldering portion 400 is formed in the insert portion 311 and the via hole 211.

The bending portion 312 includes a first bending portion 312a and a second bending portion 312b.

The first bending portion 312a integrally extends from the insert portion 311 and is coupled to the soldering portion 400. In this case, the first bending portion 312a is bent from the insert portion 311 by approximately 30 to 90 degrees. Accordingly, the first bending portion 312a inhibits the first soldering portion 410 formed at an upper portion of the via hole 211 from flowing down to a lower portion of the insulation substrate 210 when the first soldering portion 410 flows down through the via hole 211. In this case, the first soldering portion 410 is preferably prevented from flowing down through the via hole 211 whereby the protective circuit 230 is prevented from being short-circuited, thereby enabling enhancement of the battery pack 10.

The second bending portion 312b integrally extends from the first bending portion 312. The second bending portion 312b is substantially parallel to the insert portion 311. In this case, the second bending portion 312b is bent again to prevent distortion of the coupling position of the protective circuit board 200 and the multi-cell battery 100 with the first bending portion 312a being bent to prevent the soldering portion 300 from flowing down.

The assembling error control region 313 integrally extends from the bending portion 312 of the conductive tab 300 to control the assembling error of the multi-cell battery 100 and the protective circuit board 200. In the exemplary embodiment of the present invention, the assembling error control region 313 is bent several times in the direction perpendicular to the length of the conductive tab 300. Assembling error control regions 313 enable control of the distance between the protective circuit board 200 and the multi-cell battery 100 after the insert portions 311 of the first conductive tab 310 and the second conductive tab 320 are inserted into the protective circuit board 200. In other words, when the protective circuit board 200 and the multi-cell 100 are accommodated in the case, the assembling error control regions 313 are folded or expand to accurately locate the protective circuit board 200 and the multi-cell board 100 at their mounting positions inside the case, thereby shortening the manufacturing time of the battery pack 10.

The second conductive tab 320 has a shape corresponding to that of the first conductive tab 310, in which case the description thereof will not be repeated.

The first conductive tab 310 is electrically connected to the positive electrode 110 of the multi-cell battery 100, and the second conductive tab 320 is electrically connected to the negative electrode 120 of the multi-cell battery 100. In other words, the conductive tabs 300 correspond to the high current path on which a current flows when the multi-cell battery 100 is charged or discharged. In this case, the portions of the multi-cell battery 100 where the positive and negative electrodes 110 and 120 of the multi-cell battery 100 make contact with the conductive tabs 300 are resistance-welded or laser-welded so as not to increase the contact resistances. Accordingly, the thickness t10 of the conductive tabs 300 is greater than 0.2 mm so as not to overfuse the conductive tab 300 during a welding operation, and are smaller than 1.1 mm so as not to decrease the welding efficiency due to its too large thickness t10.

The conductive tabs 300 are made of nickel or a nickel-based alloy to improve the conductivity between the multi-cell battery 100 and the protective circuit board 200. The conductive tab 300 made of the material improves the coupling force with the soldering portion 400, thereby enhancing the conductivity of the protective circuit board.

Each soldering portion 400 includes a first soldering portion 410 and a second soldering portion 420.

The first soldering portion 410 is coupled to the insert portion 311 and is formed on an upper portion of the printed circuit pattern 220 formed in the via hole 211.

The second soldering portion 420 integrally extends from the first soldering portion 410. In this case, the volume of the second soldering portion 420 is set to 30 to 60% of that of the first soldering portion 410 to maintain the coupling force of the first soldering portion 410. When the volume of the second soldering portion 420 is below 30% of that of the first soldering portion 410, the coupling forces of the conductive tabs 300 to the protective circuit board 200 may decrease. On the other hand, the volume of the second soldering portion 420 is maintained no more than 60% of that of the first soldering portion 410 to prevent a short circuit of the protective circuit 230. The second soldering portion 420 is formed as the first soldering portion 410 flows down, and is soldered to a portion of the first bending portion 312a. The second soldering portion 420 flows down along the first bending portion 312a to be soldered to the first bending portion 312a, thereby improving the coupling force of the first conductive tab 310 to the protective circuit 230. In this case, the second soldering portion 420 is formed at only a peripheral portion of the first bending portion 312a so as not to be short-circuited to the protective circuit 230.

As mentioned above, the battery pack 10 according to the exemplary embodiment of the present invention prevents the soldering portions 400 from flowing down due to the existence of the first bending portions 312a when the conductive tabs 300 electrically connected to the multi-cell battery 100 are soldered to the protective circuit board 200. Accordingly, in the battery pack 10 according to the exemplary embodiment of the present invention, the possibility of the protective circuit board 200 being short-circuited by the soldering portions 400 may remarkably decrease, thereby improving reliability.

In the battery pack 10 according to the exemplary embodiment of the present invention, when the conductive tabs 300 electrically connected to the multi-cell battery 100 are soldered to the protective circuit board 200, the second bending portion 312b is formed to prevent distortion of the conductive tabs 300 from the protective circuit board 200. Accordingly, the battery pack 10 enables remarkable reduction of the number of processes of removing the soldering portions 400 and forming the soldering portions 400 again, and therefore reduction of manufacturing time.

In the battery pack 10 according to the exemplary embodiment of the present invention, the conductive tabs 300 electrically connected to the multi-cell battery 100 form the assembling error control regions 313 respectively so as to control the distance between the protective circuit board 200 and the multi-cell battery 100. Accordingly, the battery pack 10 can immediately cope with the assembling error, thereby enabling reduction of manufacturing time and enhancement of productivity.

In the battery pack 10 according to the exemplary embodiment of the present invention, the conductive tabs 300 electrically connected to the multi-cell battery 100 have plate-like shapes to enlarge the coupling areas of the soldering portions 400. Accordingly, the battery pack 10 enables enhancement of the coupling forces of the conductive tabs 300 to the protective circuit board 200, and therefore enhancement of safety.

Figure 2A:
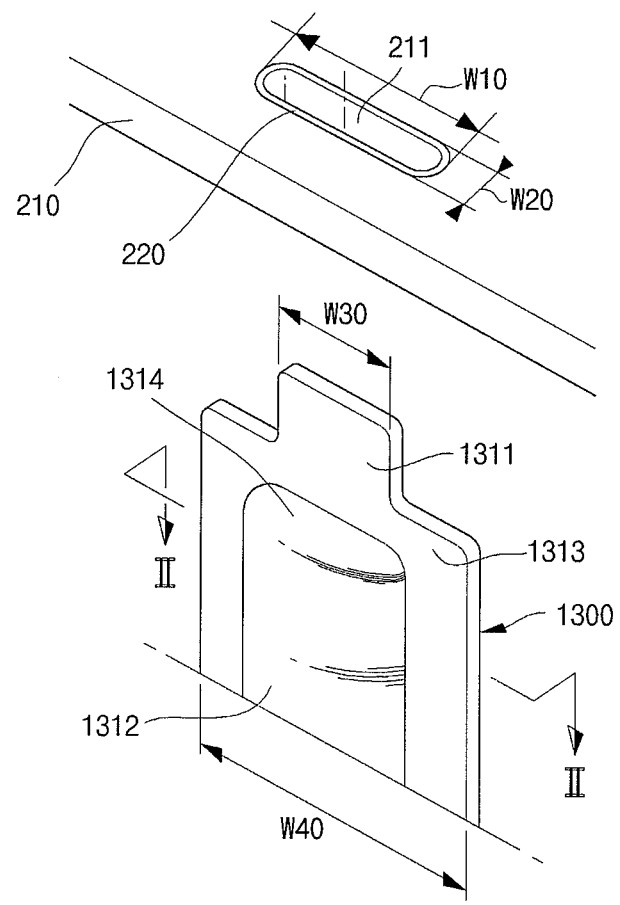
FIG. 2A is a perspective view of a conductive tab and a protective circuit board according to another exemplary embodiment of the present invention.
Figure 2B:
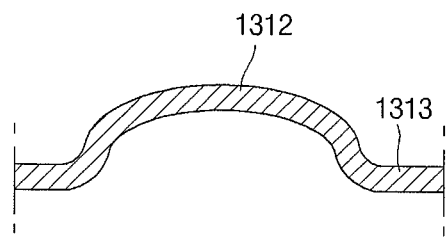
FIG. 2B is a cross-sectional view taken along line II-II of FIG. 2A.

FIG. 2A is a perspective view of a conductive tab and a protective circuit board according to another exemplary embodiment of the present invention. FIG. 2B is a cross-sectional view taken along line II-II of FIG. 2A.

Referring to FIG. 2A and FIG. 2B, the battery pack includes a multi-cell battery (not shown), a protective circuit board (not shown), a pair of conductive tabs 1300, and a pair of soldering portions (not shown).

The multi-cell battery, the protective circuit board, and the soldering portions are the same as or similar to those according to the first-mentioned exemplary embodiment of the present invention that have been described with reference to FIGS. 1A to 1D, in which case the description thereof will not be repeated. In this exemplary embodiment of the present invention, modification of the conductive tabs 1300 will be mainly described.

Each conductive tab 1300 includes an insert portion 1311 and a bending portion 1312. The conductive tab 1300 further includes a stopper portion 1313. The conductive tab 1300 may have the above-mentioned material and thickness, and may further include an assembling control region (not shown).

The insert portion 1311 is the same as the insert portion 311 of the first mentioned exemplary embodiment of the present invention, in which case the description thereof will not be repeated.

The bending portion 1312 integrally extends from the insert portion 1311. The bending portion has a convex recess-like shape. In other words, unlike the bending portion 1312 according to the first mentioned exemplary embodiment of the present invention, the bending portion 1312 according to the exemplary embodiment of the present invention is punched by a press to be bent convexly. The bending portion 1312 is convex in the direction perpendicular to the longitudinal width direction of the via hole 211. Accordingly, the bending portion 1312 prevents the soldering portion (not shown) formed in the via hole from flowing down to a lower portion of the via hole 211.

In this case, an end 1314 of the bending portion 1312 that extends from the insert portion 1311 is rounded. Accordingly, the soldering portion formed in the via hole 211 is properly formed at the rounded portion of the bending portion 1312 whereby the coupling force of the conductive tab 300 to the soldering portion remains above a predetermined strength.

The stopper portion 1313 integrally extends from the insert portion 1311 and has an area wider than the horizontal area of the insert portion 1311. In view of another aspect, the width W30 of the insert portion 1311 is set to be smaller than the width W40 of the stopper portion 1313. The width W40 of the stopper portion 1313 is much greater than the longitudinal width W10 of the via hole 211. In other words, after the insert portion 1311 is inserted into the via hole 211, the stopper portion 1313 stops further insertion of the insert portion 1311, thereby coupling the conductive tab 1300 to the protective circuit board at an accurate position.

In the battery pack according to the exemplary embodiment of the present invention, when the conductive tabs 1300 electrically connected to the multi-cell battery are soldered to the protective circuit board, the soldering portions are prevented from flowing down due to the bending portion 1312. Accordingly, the possibility of the protective circuit board being short-circuited by the soldering portions may remarkably decrease, thereby improving reliability.

In the battery pack according to the exemplary embodiment of the present invention, when the conductive tabs electrically connected to the multi-cell battery are soldered to the protective circuit board, the stopper portions 1313 enable coupling of the conductive tabs 1300 to the protective circuit board at an accurate position. Accordingly, the battery pack prevents distortion of the conductive tabs 1300 from the protective circuit board, and enables remarkable reduction of the number of processes of removing the soldering portions and forming the soldering portions again, and therefore reduction of manufacturing time.

In the battery pack according to the exemplary embodiment of the present invention, convex bending portions 1312 formed in the conductive tabs 1300 electrically connected to the multi-cell battery enlarge the coupling areas of the soldering portions. Accordingly, the battery pack enables enhancement of the coupling force of the conductive tabs 1300 to the protective circuit board, thereby ensuring stability.

Although the exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined by the appended claims.

What is claimed is:

1. A battery pack comprising:
   at least one battery having a positive electrode and a negative electrode;
   a protective circuit board electrically connected to the at least one battery and providing protection thereto and having at least one hole that extends in a first direction from a first side to a second side of the protective circuit board wherein the second side faces the at least one battery and wherein the hole defines a first lateral side and a second lateral side;
   at least one conductive tab including an insert portion inserted into a corresponding hole adjacent the first lateral side of the hole and a bending portion integrally extending from the insert portion and bent from the insert portion so as to extend in a second direction so that the bending portion extends across the at least one hole adjacent the second side of the protective circuit board wherein the insert portion and the bending portion comprise a portion of a width and wherein only a single width of the insert portion and the bending portion are positioned within the hole; and
   at least one soldering portion being formed at a corresponding insert portion and a corresponding bending portion wherein the bending portion is bent in the second direction so as to extend from the first lateral side of the hole to the second lateral side of the hole to inhibit the at least one solder portion from flowing through the hole and down the at least one conductive tab from the second side of the protective circuit board to the at least one battery wherein the bending portion integrally extends from a corresponding insert portion and includes a first bending portion coupled to a corresponding soldering portion and a second bending portion integrally extending from the first bending portion.

2. The battery pack of claim 1, wherein the at least one battery comprises a multi-cell battery, wherein the at least one hole comprising a pair of holes, wherein the at least one conductive tab comprising a pair of conductive tabs, and wherein the at least one soldering portion comprising a pair of soldering portions each being formed at least some portions of a corresponding insert portion and a corresponding bending portion.

3. The battery pack of claim 1, wherein the protective circuit board includes an insulation substrate, at least one printed circuit pattern coupled to the insulation substrate, and at least one protective circuit electrically connected to the printed circuit pattern, at least one hole passing through the insulation substrate, wherein the printed circuit pattern includes an internal pattern formed on an inner surface of the hole, an upper pattern integrally extending from the internal pattern and extending to an upper surface of the insulation substrate, and a lower pattern integrally extending from the internal pattern and extending to the lower surface of the insulation substrate.

4. The battery pack of claim 1, wherein the at least one hole has an elongated shape whose transverse width is different from a longitudinal width thereof, and passes through the insulation substrate from the upper surface to the lower surface of the insulation substrate.

5. The battery pack of claim 4, wherein the transverse width of the elongated hole is 2.2 to 8 times as long as its longitudinal width.

6. The battery pack of claim 2, wherein the conductive tabs include a first conductive tab electrically connected to a positive electrode of the multi-cell battery and a second conductive tab electrically connected to a negative electrode of the multi-cell battery.

7. The battery pack of claim 1, wherein the at least one conductive tab further includes an assembling error control region integrally extending from the bending portion to control an assembling error of the at least one battery and the protective circuit board.

8. The battery pack of claim 1, wherein the assembling error control region is bent at least two times in a direction perpendicular to a length of a corresponding conductive tab.

9. The battery pack of claim 1, wherein the protective circuit board further includes a connector whose position is controlled by the assembling error control region.

10. The battery pack of claim 1, wherein the at least one conductive tab has a thickness of 0.2 to 1.1 mm.

11. The battery pack of claim 1, wherein the soldering portion includes a first soldering portion formed between a corresponding insert portion and the protective circuit board and a second soldering portion having a volume being 30 to 60% of that of the first soldering portion.

12. The battery pack of claim 1, wherein the at least one conductive tab is made of nickel or a nickel based alloy.

13. The battery pack of claim 1, wherein the at least one conductive tab further includes a stopper portion integrally extending from a corresponding insert portion and having a width wider than that of the insert portion.

14. The battery pack of claim 13, wherein the bending portion has a convex recessed shape at a corresponding stopper portion.

15. The battery pack of claim 13, wherein an end of the bending portion that integrally extends from the insert portion is rounded.

* * * * *